United States Patent [19]

Selinder et al.

[11] Patent Number: 6,103,357
[45] Date of Patent: Aug. 15, 2000

[54] MULTILAYERED COATED CUTTING TOOL

[75] Inventors: Torbjörn Selinder, Stockholm; Christian Strondl, Uppsala, both of Sweden

[73] Assignee: Sandvik AB, Sandviken, Sweden

[21] Appl. No.: 09/060,360

[22] Filed: Apr. 15, 1998

[30] Foreign Application Priority Data

Apr. 18, 1997 [SE] Sweden ................ 9701494-8

[51] Int. Cl.$^7$ ................................ B32B 7/02
[52] U.S. Cl. .................. 428/216; 51/295; 51/307; 51/309; 428/212; 428/469; 428/697; 428/698; 428/699
[58] Field of Search .................. 428/469, 216, 428/212, 336, 697, 698, 699; 51/295, 307, 309

[56] References Cited

U.S. PATENT DOCUMENTS

| 4,554,201 | 11/1985 | Andreev et al. ............ 428/215 |
| 4,599,281 | 7/1986 | Schintlmeister et al. ........ 428/699 |
| 4,643,951 | 2/1987 | Keem et al. ............ 428/469 |
| 4,835,062 | 5/1989 | Holleck ................ 428/469 |
| 4,895,770 | 1/1990 | Schintlmeister et al. ........ 428/698 |
| 4,984,940 | 1/1991 | Bryant et al. ............ 407/119 |
| 5,503,912 | 4/1996 | Setoyama et al. ........ 428/216 |
| 5,783,295 | 7/1998 | Barnett et al. ............ 428/216 |

FOREIGN PATENT DOCUMENTS

| 0 162 656 | 11/1985 | European Pat. Off. . |
| 0 709 483 | 5/1996 | European Pat. Off. . |

*Primary Examiner*—Archene Turner
*Attorney, Agent, or Firm*—Burns, Doane, Swecker & Mathis, L.L.P.

[57] ABSTRACT

The present invention relates to a cutting tool comprising a body of sintered cemented carbide or cermet, ceramic or high speed steel on which at least one of the functioning parts of the surface of the body, a thin, adherent, hard and wear resistant coating is applied. The coating comprises a laminar, multilayered structure of refractory compounds in polycrystalline, non-repetitive form, MX/NX/MX/NX where the alternating layers MX and NX are metal nitrides or carbides with the metal elements M and N selected from the group consisting of Ti, Nb, Hf, V, Ta, Mo, Zr, Cr, Al and W. The sequence of individual layer thicknesses is essentially aperiodic throughout the entire multilayered structure, and layer thicknesses are larger than 0.1 nanometer but smaller than 30 nanometer, preferably smaller than 20 nanometer. The total thickness of said multilayered coating is larger than 0.5 μm but smaller than 20 μm.

15 Claims, 1 Drawing Sheet

MULTILAYERED COATED CUTTING TOOL

BACKGROUND OF THE INVENTION

The present invention relates to a cutting tool for metal machining, having a substrate of cemented carbide, cermet, ceramics or high speed steel and, on the surface of said substrate, a hard and wear resistant refractory coating is deposited by Physical (PVD) or Chemical (CVD) Vapor Deposition. The coating is adherently bonded to the substrate and is composed of a laminar, multilayered structure of alternating metal nitrides or carbides with individual layers, or lamellae, having an aperiodic sequence of thicknesses. With this structure, it is understood that the multilayer has no superlattice repeat period. Individual metal nitride or carbide layers have thicknesses in the nanometer range (nm) and the metal elements of the nitride or carbide are selected from the group consisting of Ti, Nb, Hf, V, Ta, Mo, Zr, Cr Al, W and mixtures thereof.

The present invention relates particularly to the art of PVD coated cemented carbides or similar hard materials such as cermets, ceramics and high speed steels. The method of depositing a thin refractory coating (1–20 $\mu$m) of materials like alumina ($Al_2O_3$), titanium carbide (TiC) and/or titanium nitride (TiN) onto, e.g., a cemented carbide cutting tool, is a well-established technology and the tool life of the coated cutting tool, when used in metal machining, is considerably prolonged. The prolonged services life of the tool may, under certain conditions, extend up to several 100 percent. Refractory coatings known in the art comprise either a single layer or a combination of multilayers. Modern commercial cutting tools are characterized by a plurality of layer combinations with double or multilayer structures. The total coating thickness varies between 1 and 20 $\mu$m and in the prior art, the multilayered structure is characterized in the micrometer range ($\mu$m), i.e., the thickness of the individual sublayers varies between a few microns and a few tenths of a micron.

The established technologies for depositing such coatings are CVD and PVD (see, e.g., U.S. Pat. Nos. 4,619,866 and 4,346,123). PVD coated commercial cutting tools of cemented carbides or high speed steels usually have a single coating of TiN, TiCN, or TiAlN, but combinations thereof also exist.

There exist several PVD techniques capable of producing refractory thin layers on cutting tools. The most established methods are ion plating, magnetron sputtering, arc discharge evaporation and IBAD (Ion Beam Assisted Deposition). Each method has its own merits and the intrinsic properties of the produced coating such as microstructure/grain size, hardness, state of stress, cohesion and adhesion to the underlying substrate may vary depending on the particular PVD method chosen. An improvement in the wear resistance or the edge integrity of a PVD coated cutting tool being used in a specific machining operation can thus be accomplished by optimizing one or several of the above-mentioned properties. Furthermore, new developments of the existing PVD techniques by, for instance, introducing unbalanced magnetrons in reactive sputtering (S. Kadlec, J. Musil and W.-D. Munz in J. Vac. Sci. Techn. A8(3), (1990), 1318) or applying a steered and/or filtered arc in cathodic arc deposition (H. Curtins in *Surface and Coatings Technology*, 76/77, (1995), 632 and K. Atari et al. in *Surface and Coatings Technology*, 43/44, (1990), 312) have resulted in a better control of the coating processes and a further improvement of the intrinsic properties of the coating material.

Conventional cutting tool materials like cemented carbides comprise at least one hard metallic compound and a binder, usually cobalt (Co), where the grain size of the hard compound, e.g., tungsten carbide (WC), is in the 1–5 $\mu$m range. Recent developments have predicted improved tool properties in wear resistance, impact strength and hot hardness by applying tool materials based on ultrafine microstructures by using nanostructured WC-Co powders as raw materials (L. E. McClandlish, B. H. Kear and B. K. Kim, in *NanoSTRUCTURED Materials*, Vol. 1, pp. 119–124, 1992). Similar predictions have been made for ceramic tool materials by, for instance, applying silicon nitride/carbide-based ($Si_3N_4$/SiC) nanocomposite ceramics and, for $Al_2O_3$-based ceramics, equivalent nanocomposites based on alumina.

With nanocomposite nitride or carbide hard coating materials, it is understood a multilayered coating where the thickness of each individual nitride (or carbide) layer is in the nanometer range, 3–100 nm, or preferably 3–20 nm. Since a certain periodicity or repeat period of, e.g., a metal nitride layer sequence is invoked, these nanoscaled, multilayer coatings have been given the generic name of "superlattice" layers. A repeat period is the thickness of two adjacent metal nitride layers, i.e., with different metal elements in the sublayers. Several of the metal nitride superlattice coatings with the metal element selected from Ti, Nb, V and Ta, grown on both single- and polycrystalline substrates have shown an enhanced hardness for a particular repeat period, usually in the range of 3–10 nm.

OBJECTS AND SUMMARY OF THE INVENTION

It is an object of this invention to avoid or alleviate the problems of the prior art.

It is further an object of this invention to provide a cutting tool for metal machining, having a substrate of cemented carbide, cermet, ceramics or high speed steel and, on the surface of said substrate, a hard and wear resistant refractory coating is deposited by PVD or CVD techniques.

It is an aspect of the invention to provide a cutting tool comprising a body selected from the group consisting of sintered cemented carbide or cermet, ceramic or high speed steel and a wear resistant coating on at least part of the surface of the body, said coating comprising a laminar, multilayered structure of refractory compounds in polycrystalline, non-repetitive form, MX/NX/MX/NX/MX . . . , where the alternating layers MX and NX are composed of metal nitrides or carbides with the metal elements M and N are selected from the group consisting of Ti, Nb, Hf, V, Ta, Mo, Zr, Cr, Al, and W and mixtures therein, where in said coating the sequence of individual layer thicknesses has no repeat period but is essentially aperiodic throughout the entire mulitlayered structure, and where the said individual MX or NX layer thickness is larger than 0.1 nm but smaller than 30 nm and, varies essentially at random, and that the total thickness of said multilayered coating is larger than 0.5 $\mu$m but smaller than 20 $\mu$m.

BRIEF DESCRIPTION OF THE DRAWINGS

The FIGURE is a schematic drawing showing a substrate 1 coated with a laminar, multilayered nitride or carbide coating 2 with the individual binary metal nitride (or carbide) layers being MX 3 and NX 4 and an individual layer thickness 5, the sequence of individual layer thicknesses being essentially aperiodic throughout the entire multilayer coating.

DETAILED DESCRIPTION OF THE PREFERRED EMBODIMENTS OF THE INVENTION

Figure 1:
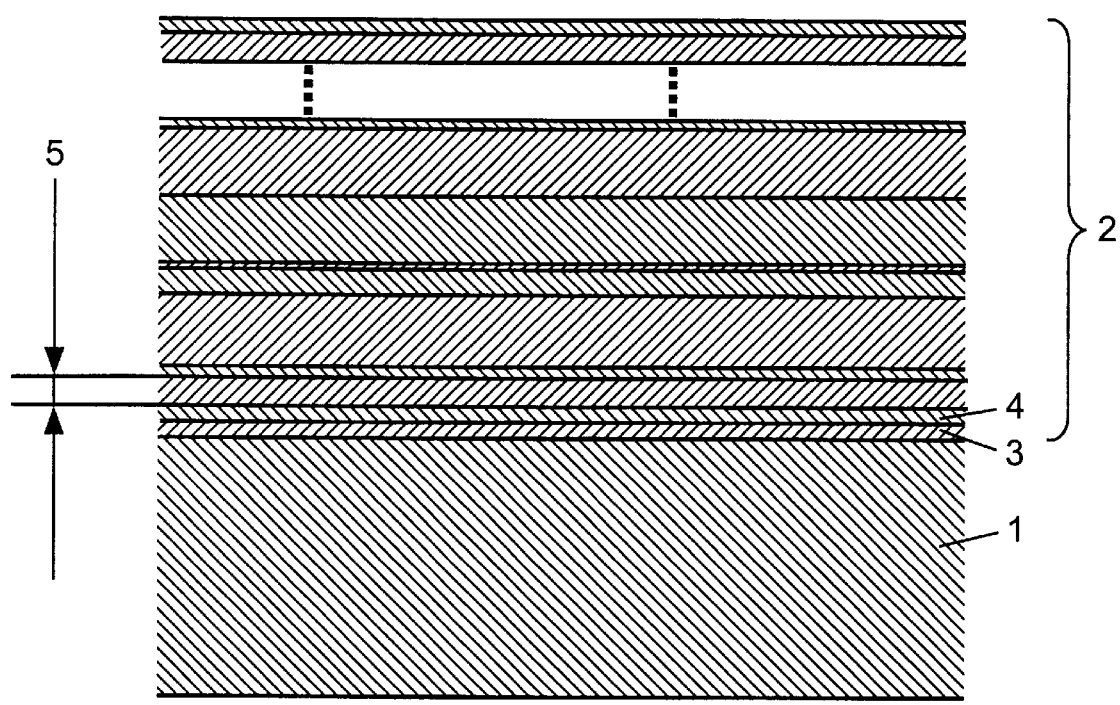

According to the presently claimed invention, there is provided a cutting tool comprising a body of a hard alloy of cemented carbide, cermet, ceramics or high speed steel, onto which a wear resistant, multilayered coating has been deposited. More specifically, the coated tool comprises a substrate of sintered cemented carbide body or a cermet, preferably of at least one metal carbide in a metal binder phase, or a ceramic body. The substrate may also comprise a high speed steel alloy. Said substrate may also be precoated with a thin single or multilayer of TiN, TiC, TiCN or TiAlN with a thickness in the micrometer range according to prior art. The coated cutting tool according to the presently claimed invention, exhibits improved wear resistance and toughness properties compared to prior art tools when used for machining steel or cast iron and, in particular, stainless steel. Said coating, which is adherently bonded to the substrate, comprises a laminar, multilayered structure of metal nitrides or carbides, preferably of binary polycrystalline nitrides, having a thickness of 0.5 to 20 µm, preferably 1 to 10 µm, most preferably 2 to 6 µm. In the binary, multilayered coating structure (see the Figure) MX/NX/MX/NX . . . , the alternating layers MX and NX comprise metal nitrides or metal carbides with the metal elements M and N selected from titanium (Ti), niobium (Nb), hafnium (Hf), vanadium (V), tantalum (Ta), molybdenum (Mo), zirconium (Zr), chromium (Cr), aluminum (Al) or tungsten (W) and mixtures therof, and in said coating there is no repeat period. The sequence of individual MX and NX layers have thicknesses that are aperiodic throughout the entire multilayer structure. Furthermore, the minimum individual layer thickness is larger than 0.1 nm but smaller than 30 nm, preferably larger than 1 nm but smaller than 20 nm, most preferably larger than 2 nm but smaller than 15 nm. The thickness of one individual layer does not depend on the thickness of an individual layer immediately beneath nor does it bear any relation to an individual layer above the said one individual layer. Hence, in contrast to superlattices, the aperiodic coatings of the present invention do not have a repeat period. The total thickness of the multilayered coating is between 0.5 and 20 µm Preferred examples of the above aperiodic coatings are TiN/NbN/TiN/NbN/ . . . , TiN/TaN/TiN/TaN/ . . . , TiN/VN/TiN/VN/ . . . and TiN/(Ti,Al)N/TiN/(Ti,Al)N . . . , particularly with (Ti,Al)=Ti$_{1-x}$Al$_x$ with 0.4<x<0.6

The laminar coatings above exhibit a columnar growth mode with no or very little porosity at the grain boundaries. The coatings also possess a substantial waviness in the sublayers which originates from the substrate surface roughness. High magnification transmission electron microscopy (TEM) indicates an aperiodic structure , i.e., the sequence of layer thicknesses does not repeat itself, having relatively sharp interfaces between any two subsequent individual layers.

For a cutting tool used in metal machining, several advantages are provided by the present invention with nanostructured lamellae coatings deposited on substrates of hard, refractory materials such as cemented carbides, cermets and ceramics. In a binary nitride lamellae coating MX/NX/MX/NX . . . on cemented carbides, the hardness of the coating is usually enhanced over the single individual layers of MX and/or NX of a similar layer thickness on a µm scale, while the intrinsic stress numerically is smaller. The first observation, enhanced hardness in the coating, results in an increased abrasive wear resistance of the cutting edge while the second observation of numerically less intrinsic stress in the coating provides an increased capability of absorbing stresses exerted on the cutting edge during a machining operation.

The laminar, nanostructured coatings can be deposited on a cemented carbide, cermet, ceramic or high speed steel substrate either by CVD or PVD techniques, preferentially by PVD techniques, by successively forming individual sublayers by vapor deposition in a vacuum chamber. The aperiodic sequence of individual layer thicknesses can be fabricated by randomly opening and closing shutters from individual layer sources or by randomly switching such sources on and off. Another conceivable method is by randomly rotating or moving the to-be-coated tools, substrates, in front of said sources. Electron beam evaporation, magnetron sputtering or cathodic arc deposition or combinations thereof, are the preferred PVD methods for depositing the nanostructured coatings.

The invention is additionally illustrated in connection with the following Example which is to be considered as illustrative of the present invention. It should be understood, however, that the invention is not limited to the specific details of the Example.

EXAMPLE

Aperiodic multilayers were deposited by reactive PVD-magnetron sputtering on thread-forming turning inserts made of cemented carbide (WC-10 w %Co). The two sputtering sources consisted of pure Ti and TiAl alloy, respectively, and sputtering was performed in an Ar/N$_2$ gas mixture. The resulting total coating thickness was 3.0 µm, and consisted of a TiN/Ti$_{1-x}$Al$_x$N, with x=0.50, multilayer having a sequence of individual lamellae layers with an aperiodic, i.e., nonrepetitive thickness. Cross-section transmission electron microscopy investigation revealed that the individual nitride layer thicknesses ranged from 2 to 15 nm, and the total number of layers exceeded 400.

In a thread turning operation, it was found that the flank wear resistance, effectively the tool service life, was improved markedly compared to both TiN and TiAlN single layer coatings having the same total thicknesses as the multilayer.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool comprising a body selected from the group consisting of sintered cemented carbide or cermet, ceramic or high speed steel and a wear resistant coating on at least part of the surface of the body, said coating comprising a laminar, multilayered structure of refractory compounds in polycrystalline, non-repetitive form, MX/NX/MX/NX/MX . . . , where the alternating layers MX and NX are composed of metal nitrides or carbides with the metal elements M and N are selected from the group consisting of Ti, Nb, Hf, V, Ta, Mo, Zr, Cr, Al, and W and mixtures therein, wherein the sequence of individual layer thicknesses in said coating has no repeat period but is essentially aperiodic throughout the entire multilayered structure, and where the said individual MX or NX layer thickness is larger than 0.1 nm but smaller than 30 nm and, varies essentially at random, and that the total thickness of said multilayered coating is larger than 0.5 µm but smaller than 20 µm.

2. The cutting tool of claim 1 wherein the said individual MX or NX layer thickness is smaller than 20 nm.

3. The cutting tool of claim 1 wherein the alternating layers MX and NX are metal nitrides.

4. The cutting tool of claim 1 wherein the alternating layers MX and NX are metal carbides.

5. The cutting tool of claim 1 wherein M and N in the alternating layers MX and NX are Ti and Nb, respectively.

6. The cutting tool of claim 1 wherein M and N in alternating layers MX and NX are Ti and Ta, respectively.

7. The cutting tool of claim 1 wherein M and N in alternating layers are Ti and V.

8. The cutting tool of claim 1 wherein M and N in alternating layers MX and NX are Ti and TiAl.

9. The cutting tool of claim 1 wherein M and N in alternating layers MX and NX are Ti and $Ti_{1-x}Al_x$ with $0.4<x<0.6$.

10. The cutting tool of claim 1 wherein the individual layer thickness is between 1 and 20 nanometers.

11. The cutting tool of claim 10 wherein the individual layer thickness is from 2 to 15 nanometers.

12. The cutting tool of claim 1 wherein said coating has a total thickness of 1 to 10 $\mu$m.

13. The cutting tool of claim 12 wherein said coating has a total thickness of 2 to 6 $\mu$m.

14. The cutting tool of claim 1 wherein said body is a sintered cemented carbide or a cermet.

15. The cutting tool of claim 1 wherein the alternating layers MX and NX are binary polycrystalline nitrides.

* * * * *